United States Patent
Baba

(10) Patent No.: US 8,724,683 B2
(45) Date of Patent: May 13, 2014

(54) COMMUNICATION TESTING CIRCUIT, ELECTRONIC DEVICE, RECEIVING CIRCUIT, TRANSMITTING CIRCUIT, SEMICONDUCTOR INTEGRATED CIRCUIT, AND WAFER

(75) Inventor: Mitsuo Baba, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 362 days.

(21) Appl. No.: 13/116,060

(22) Filed: May 26, 2011

(65) Prior Publication Data

US 2011/0299569 A1 Dec. 8, 2011

(30) Foreign Application Priority Data

Jun. 4, 2010 (JP) ................................. 2010-128859
Mar. 8, 2011 (JP) ................................. 2011-050164

(51) Int. Cl.
*H04B 3/46* (2006.01)
*H04B 17/00* (2006.01)

(52) U.S. Cl.
USPC ....................................................... 375/224

(58) Field of Classification Search
CPC ............... G01R 29/26; G01R 31/2882; G01R 31/31707; G01R 31/31709; G01R 31/3171; G01R 31/31725; G01R 31/3183; G01R 31/318371; G01R 31/318385; H04B 3/46; H04B 17/004; H04L 1/20; H04L 1/205; H04L 1/24
USPC ......................................... 375/224, 226, 227
See application file for complete search history.

(56) References Cited

U.S. PATENT DOCUMENTS

| | | | | |
|---|---|---|---|---|
| 7,142,623 B2* | 11/2006 | Sorna | ............................. | 375/376 |
| 7,492,180 B2* | 2/2009 | Forstner | ..................... | 324/750.3 |
| 2003/0035473 A1* | 2/2003 | Takinosawa | .................. | 375/224 |
| 2005/0156586 A1 | 7/2005 | Kanbayashi | | |
| 2005/0258856 A1 | 11/2005 | Kishimoto et al. | | |
| 2006/0253752 A1 | 11/2006 | Krishnan et al. | | |
| 2008/0172195 A1 | 7/2008 | Nakadaira | | |
| 2009/0160493 A1* | 6/2009 | You et al. | ....................... | 327/105 |
| 2009/0323445 A1* | 12/2009 | Adams et al. | ................. | 365/201 |
| 2010/0037280 A1 | 2/2010 | Nishimura | | |

FOREIGN PATENT DOCUMENTS

JP    H05-268298 A    12/1993

(Continued)

OTHER PUBLICATIONS

Notification of Reasons for Refusal for Japanese Application No. 2011-050164 mailed Mar. 25, 2014 with English Translation.

*Primary Examiner* — David B. Lugo
(74) *Attorney, Agent, or Firm* — Foley & Lardner LLP

(57) ABSTRACT

Provided is a communication testing circuit that includes a transmitting unit including a spread spectrum clock generator that generates a modulated clock signal by modulating a reference clock signal, a pseudo-random binary sequence generator that generates a pseudo-random pattern, and a signal generator that generates a transmission signal by modulating the pseudo-random pattern based on the modulated clock signal, a receiving unit including a clock and data recovery circuit that receives the transmission signal and recovers the pseudo-random pattern from the transmission signal, and a detector that compares the recovered pseudo-random pattern with a preset pseudo-random pattern and outputs a signal indicating error information, and a control unit that counts a number of errors from the signal indicating error information input from the receiving unit and decides a timing margin based on a counting result.

11 Claims, 10 Drawing Sheets

(56) References Cited

FOREIGN PATENT DOCUMENTS

| | | | |
|---|---|---|---|
| JP | 2005-233933 A | 9/2005 |
| JP | 2005-337740 A | 12/2005 |
| JP | 2007-294758 A | 11/2007 |
| JP | 2008-175646 A | 7/2008 |
| JP | 2008-541059 A | 11/2008 |
| JP | 2010-041615 A | 2/2010 |

* cited by examiner

COMMUNICATION TESTING CIRCUIT, ELECTRONIC DEVICE, RECEIVING CIRCUIT, TRANSMITTING CIRCUIT, SEMICONDUCTOR INTEGRATED CIRCUIT, AND WAFER

CROSS-REFERENCE TO RELATED APPLICATIONS

This application is based upon and claims the benefit of priority from Japanese patent application No. 2010-128859, filed on Jun. 4, 2010 and Japanese patent application No. 2011-50164, filed on Mar. 8, 2011, the disclosure of which is incorporated herein in its entirety by reference.

BACKGROUND

The present invention relates to a communication testing circuit, an electronic device, a receiving circuit, a transmitting circuit, a semiconductor integrated circuit, and a wafer.

In consumer electronics, particularly digital AV devices that handle high-volume video data such as full high definition, the shift from low-speed parallel communication to high-speed serial communication is accelerated between LSIs (large-scale integrations) of the same substrate, between LSIs of different substrates, between devices or the like.

Compatibility between high quality and low cost is important in this area where mass production is done, and in the field of high-speed serial communication also, it is required to implement a system that prevents defective products from reaching the market at low cost.

As related techniques, the following methods are generally performed.

Method 1: As a testing method at the transmitting end, quantitative evaluation of a timing margin is performed by waveform measurements using an oscilloscope.

Method 2: As a testing method at the receiving end, quantitative evaluation of a timing margin is performed by jitter tolerance measurements using a data generator with a jitter generation function (cf. Japanese Unexamined Patent Publication No. 2005-233933).

Method 3: Testing of a serial communication part is conducted by incorporating a pseudo-random binary sequence generator into a circuit at the transmitting end and checking the presence or absence of a data communication error in a pseudo-random pattern detector incorporated in a circuit at the receiving end.

SUMMARY

According to the methods 1 and 2, quantitative evaluation of a timing margin can be performed. However, because measurements take time, it is difficult to apply those methods to 100-percent testing prior to shipment.

On the other hand, the method 3 is applicable to 100-percent testing prior to shipment. However, because the method 3 determines the presence or absence of a communication error, it is unable to quantitatively determine the presence or absence of a timing margin. Therefore, according to the method 3, there is a possibility that a product which fails to achieve a timing margin that is set at the design stage is shipped as a non-defective product.

A first aspect of the present invention is a communication testing circuit including a transmitting unit including a spread spectrum clock generator that generates a modulated clock signal by modulating a reference clock signal, a pseudo-random binary sequence generator that generates a pseudo-random pattern, and a signal generator that generates a transmission signal by modulating the pseudo-random pattern based on the modulated clock signal; a receiving unit including a clock and data recovery circuit that receives the transmission signal and recovers the pseudo-random pattern from the transmission signal, and a detector that compares the recovered pseudo-random pattern with a preset pseudo-random pattern and outputs a signal indicating error information; and a control unit that counts a number of errors from the signal indicating error information input from the receiving unit and decides a timing margin based on a counting result.

The communication testing circuit applies a mechanism that controls the modulation setting of the spread spectrum clock generator which is generally included as standard equipment in a transmitting-end device in order to reduce EMI, and characteristics of tracking skew that occurs when tracking a frequency modulation which are seen in the clock and data recovery circuit of a receiving-end device, and need no special measuring instrument. Therefore, the transmitting unit and the receiving unit can be used not only for testing but also for normal operation, and it is possible to quantitatively decide a transmitting/receiving timing margin in serial communication at low cost and in short time.

A second aspect of the present invention is an electronic device including the above-described communication testing circuit. The transmitting unit and the receiving unit can be thereby used not only for testing but also for normal operation, and it is possible to quantitatively decide a transmitting/receiving timing margin in serial communication at low cost and in short time.

A third aspect of the present invention is a semiconductor integrated circuit including the above-described communication testing circuit. The transmitting unit and the receiving unit can be thereby used not only for testing but also for normal operation, and it is possible to quantitatively decide a transmitting/receiving timing margin in serial communication at low cost and in short time.

A fourth aspect of the present invention is a receiving circuit including a clock and data recovery circuit that receives a transmission signal generated by modulating serial data converted from a pseudo-random pattern based on a clock signal and recovers the pseudo-random pattern from the transmission signal, a detector that compares the recovered pseudo-random pattern with a preset pseudo-random pattern and outputs a signal indicating error information, and an output terminal of the signal indicating error information. A power supply and a ground of the receiving circuit and a power supply and a ground of a transmitting circuit that is electrically connected to the receiving circuit can be thereby made different, for example, and it is thereby possible to bring test conditions closer to actual use conditions.

A fifth aspect of the present invention is a semiconductor integrated circuit including the above-described receiving circuit. The receiving circuit mounted on the semiconductor integrated circuit can be thereby electrically connected to a transmitting circuit that is mounted on another semiconductor integrated circuit, a testing board, or a tester.

A sixth aspect of the present invention is a transmitting circuit including a transmitting unit including a spread spectrum clock generator that generates a modulated clock signal by modulating a reference clock signal, a pseudo-random binary sequence generator that generates a pseudo-random pattern, and a signal generator that generates a transmission signal by modulating the pseudo-random pattern based on the modulated clock signal; a control unit that receives a signal indicating error information being a comparison result of a pseudo-random pattern recovered from the transmission signal with a preset pseudo-random pattern, counts a number of errors from the signal indicating error information, and decides a timing margin based on a counting result, and an input terminal of the signal indicating error information. A power supply and a ground of a receiving circuit that is electrically connected to the transmitting circuit and a power supply and a ground of the transmitting circuit can be thereby made different, for example, and it is thereby possible to bring test conditions closer to actual use conditions.

A seventh aspect of the present invention is a semiconductor integrated circuit including the above-described transmitting circuit. The transmitting circuit mounted on the semiconductor integrated circuit can be thereby electrically connected to a receiving circuit that is mounted on another semiconductor integrated circuit, a testing board, or a tester.

An eighth aspect of the present invention is a wafer in which the above-described receiving circuit and the above-described transmitting circuit are formed on adjacent chips. It is thereby possible to easily conduct testing between the adjacent chips.

According to the above-described aspects of the present invention, it is possible to quantitatively decide a transmitting/receiving timing margin at low cost and in short time.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

A communication testing circuit and an electronic device according to embodiments of the present invention will be described hereinbelow. The present invention, however, is not limited to the following embodiments. Further, the following description and the attached drawings are appropriately shortened and simplified to clarify the explanation.

The communication testing circuit and the electronic device apply a mechanism that controls the modulation setting of a spread spectrum clock generator which is generally included as standard equipment in a transmitting-end device in order to reduce EMI (Electro Magnetic Interference), and characteristics of tracking skew that occurs when tracking a frequency modulation which are seen in a CDR (Clock and Data Recovery) circuit of a receiving-end device, and need no special measuring instrument. The communication testing circuit and the electronic device thereby enable quantitative decision of a transmitting/receiving timing margin in serial communication at low cost and in short time.

<First Embodiment>

Figure 1:
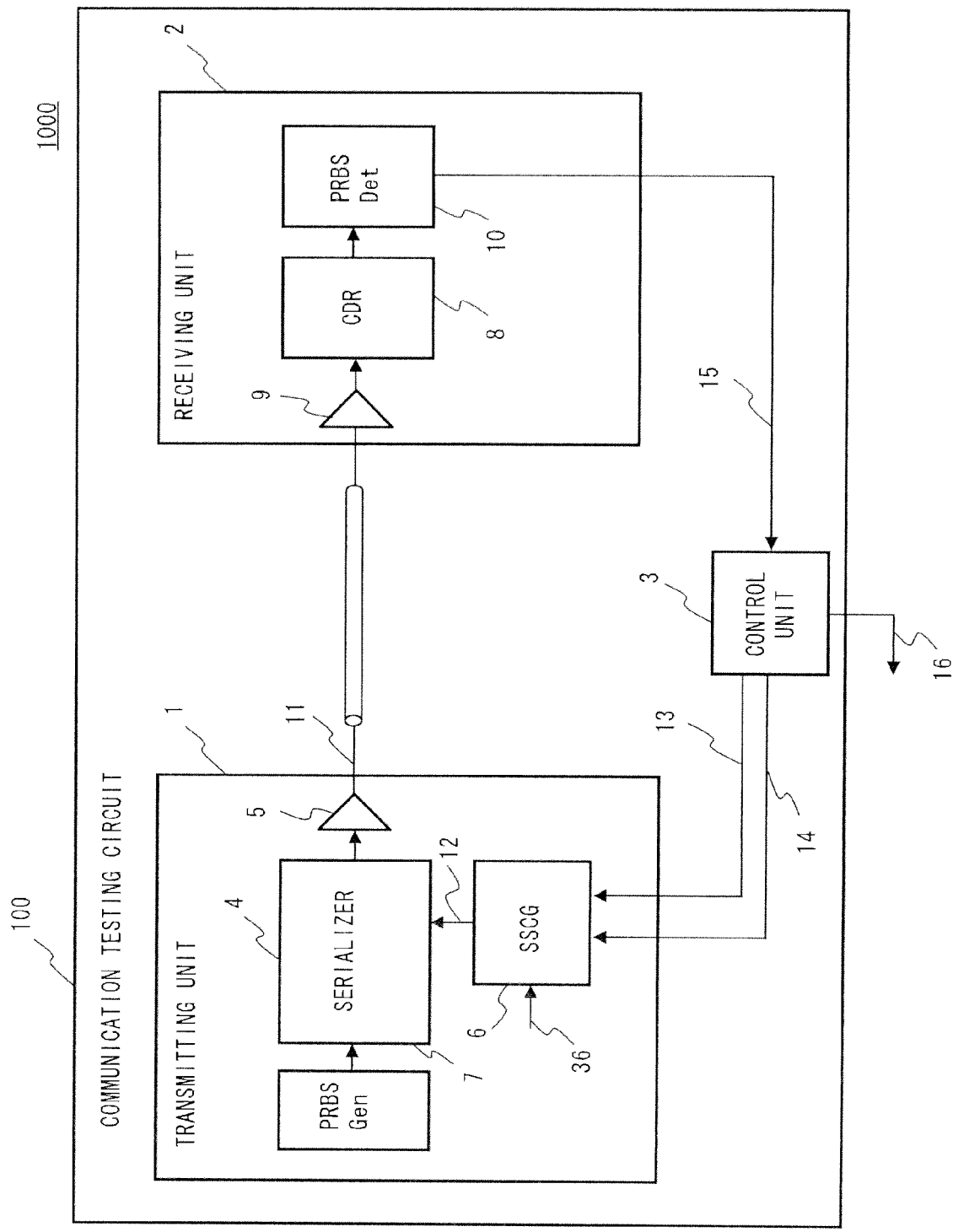
FIG. 1 is a block diagram showing a configuration of an electronic device that includes a communication testing circuit according to a first embodiment of the invention.

FIG. 1 shows a configuration of a communication testing circuit according to a first embodiment of the invention.

A communication testing circuit 100 according to the embodiment is included in an electronic device 1000 that is equipped with a high-speed serial communication interface, for example, as shown in FIG. 1. The communication testing circuit 100 includes a transmitting unit 1, a receiving unit 2, and a control unit 3.

The transmitting unit 1 includes a spread spectrum clock generator (SSCG) 6, a pseudo-random binary sequence generator (PRBS Gen) 7, a serializer (signal generator) 4, and an output circuit 5.

A reference clock signal 36 is input to the spread spectrum clock generator 6 from a clock source or the like included in the electronic device 1000, for example. Further, a modulation factor setting signal 13 and a modulation frequency setting signal 14 are input to the spread spectrum clock generator 6 from the control unit 3. The spread spectrum clock generator 6 modulates the reference clock signal 36 based on the modulation factor setting signal 13 and the modulation frequency setting signal 14. The spread spectrum clock generator 6 outputs a modulated clock signal 12 to the serializer 4. Thus, the spread spectrum clock generator 6 has a configuration that can set a modulation factor and a modulation frequency of the reference clock signal 36 in a variable manner based on the modulation factor setting signal 13 and the modulation frequency setting signal 14 that are input from the control unit 3.

The pseudo-random binary sequence generator 7 generates a pseudo-random pattern and outputs it to the serializer 4.

The modulated clock signal 12 is input to the serializer 4 from the spread spectrum clock generator 6. Further, the pseudo-random pattern is input to the serializer 4 from the pseudo-random binary sequence generator 7. The serializer 4 converts the pseudo-random pattern into serial data, modulates the serial data using the clock signal 12, and outputs modulated data (transmission signal) 11 to the output circuit 5.

The modulated data 11 is input to the output circuit 5 from the serializer 4. The output circuit 5 transmits the modulated data 11 to the receiving unit 2.

The receiving unit 2 includes an input circuit 9, a clock and data recovery circuit (CDR) 8, and a pseudo-random binary sequence detector (PRBS Det) 10.

The input circuit 9 receives the modulated data 11 from the output circuit 5 of the transmitting unit 1. The input circuit 9 outputs the modulated data 11 to the clock and data recovery circuit 8.

Figure 2:
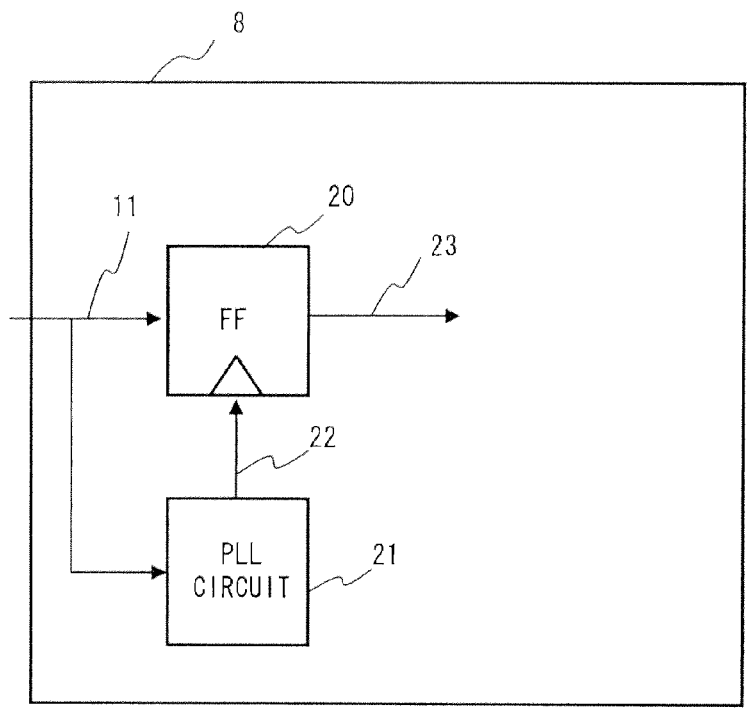
FIG. 2 is a block diagram showing a configuration of a clock and data recovery circuit.

The modulated data 11 is input to the clock and data recovery circuit 8 from the input circuit 9. The clock and data recovery circuit 8 extracts a clock signal from the modulated data 11 and recovers the pseudo-random pattern. Specifically, the clock and data recovery circuit 8 includes a PLL (Phase Locked Loop) circuit 21, and a data retiming FF (Flip-Flop) 20 as shown in FIG. 2.

The PLL circuit 21 extracts a clock signal 22 from the modulated data 11 and outputs the extracted clock signal 22 to the data retiming FF 20. The extracted clock signal 22 is input to the data retiming FF 20 from the PLL circuit 21. The data retiming FF 20 recovers the pseudo-random pattern (the modulated data 11) converted into the serial data based on the extracted clock signal 22 and outputs the recovered pseudo-random pattern 23 to the pseudo-random binary sequence detector 10.

The recovered pseudo-random pattern 23 is input to the pseudo-random binary sequence detector 10 from the clock and data recovery circuit 8. On the other hand, the pseudo-random binary sequence detector 10 generates a preset pseudo-random pattern based on seed information. The pseudo-random binary sequence detector 10 compares (checks) the input pseudo-random pattern 23 against the pseudo-random pattern generated by its own and decides whether an error is occurring. The pseudo-random binary sequence detector 10 outputs a signal 15 indicating error information, which is a decision result, to the control unit 3. For example, the signal 15 of High level indicates an error, and the signal 15 of Low level indicates no error.

Figure 3:
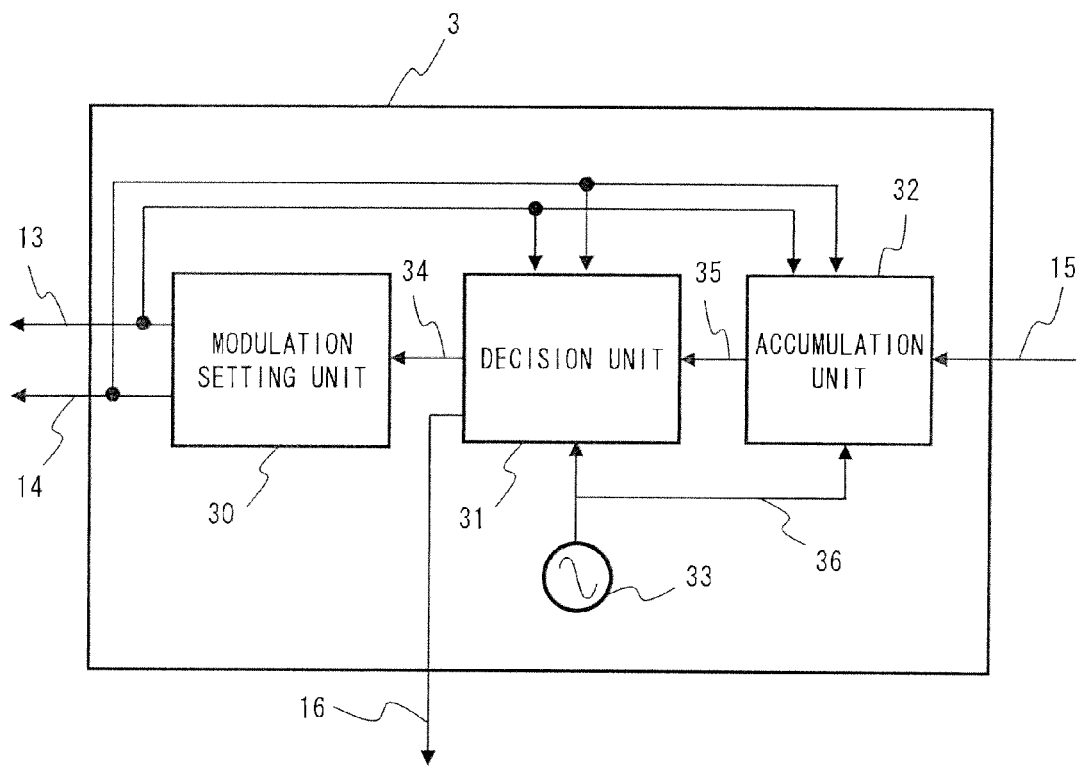
FIG. 3 is a block diagram showing a configuration of a control unit.

The control unit 3 includes a clock source 33, an accumulation unit 32, a decision unit 31, and a modulation setting unit 30 as shown in FIG. 3. The clock source 33 generates the reference clock signal 36. The clock source 33 outputs the generated reference clock signal 36 to the decision unit 31 and the accumulation unit 32.

The reference clock signal 36 is input to the accumulation unit 32 from the clock source 33. Further, the signal 15 indicating error information is input to the accumulation unit 32 from the pseudo-random binary sequence detector 10 of the receiving unit 2. Furthermore, the modulation factor setting signal 13 and the modulation frequency setting signal 14 that are generated by the modulation setting unit 30 are input to the accumulation unit 32. The accumulation unit 32 counts the number of errors from the signal 15 indicating error information for a set period of time based on the reference clock signal 36 and the modulation frequency setting signal 14. The accumulation unit 32 outputs a signal 35 indicating the number of errors counted for the set period of time to the decision unit 31.

Figure 4:
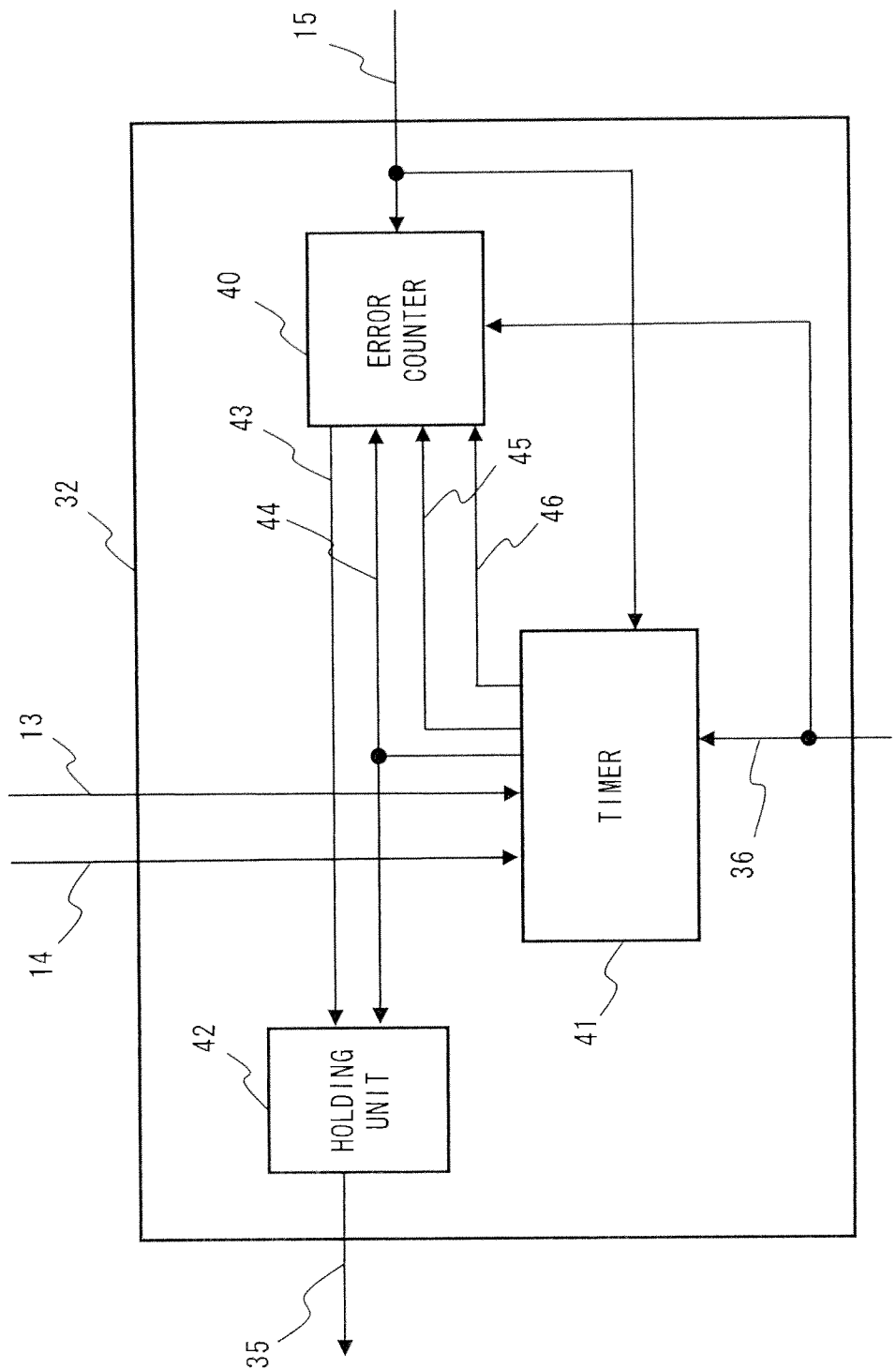
FIG. 4 is a block diagram showing a configuration of an accumulation unit.

Specifically, the accumulation unit 32 includes an error counter 40, a timer 41, and a holding unit 42 as shown in FIG. 4. The signal 15 indicating error information is input to the error counter 40 from the pseudo-random binary sequence detector 10 of the receiving unit 2. Further, a counting period signal 44, an invalidation signal 45, and a clear signal 46 are input to the error counter 40 from the timer 41. Furthermore, the reference clock signal 36 is input to the error counter 40 from the clock source 33.

The error counter 40 counts the number of errors from the signal 15 indicating error information for a period of time which is indicated by the counting period signal 44 (excluding a period when the invalidation signal 45 is placed, as is described in detail later) after the clear signal 46 is removed based on the reference clock signal 36. Then, the error counter 40 outputs an error count signal 43 indicating the counted number of errors during the specified period to the holding unit 42.

The reference clock signal 36 is input to the timer 41 from the clock source 33. Further, the signal 15 indicating error information is input to the timer 41 from the pseudo-random binary sequence detector 10. Furthermore, the modulation factor setting signal 13 and the modulation frequency setting signal 14 are input to the timer 41 from the modulation setting unit 30. The timer 41 has a function of correcting the count when an error is detected in the signal 15 indicating error information so as to adjust points where the slope of modulation of modulated data changes, which are indicated by (a), (b), (c), (d) and (e) in FIG. 7, to the time when the error is detected. Note that the correction of the count has a protecting function that is performed when the same count value is detected N times in succession. N is a natural number of 1 or above. This is because it is difficult to specify the point where the slope of modulation changes only from the modulation factor setting signal 13 and the modulation frequency setting signal 14.

The timer 41 generates the counting period signal 44, the invalidation signal 45 and the clear signal 46 based on the modulation factor setting signal 13, the modulation frequency setting signal 14, and the count value of the reference clock signal 36. The timer 41 outputs the generated counting period signal 44 to the error counter 40 and the holding unit 42. The timer 41 further outputs the invalidation signal 45 and the clear signal 46 to the error counter 40. The invalidation signal 45 is a command signal that invalidates the count of errors during the counting period, as is described in detail later. The clear signal 46 is a command signal that resets the count of errors.

The error count signal 43 is input to the holding unit 42 from the error counter 40. Further, the counting period signal 44 is input to the holding unit 42 from the timer 41. The holding unit 42 holds the count of errors which is indicated by the error count signal 43. Then, the holding unit 42 outputs a signal 35 indicating the count of errors to the decision unit 31. The holding unit 42 updates the count of errors indicated by the error count signal 43 each time the counting period has elapsed based on the counting period signal 44.

The signal 35 indicating the count of errors is input to the decision unit 31 from the holding unit 42. Further, the modulation factor setting signal 13 and the modulation frequency setting signal 14 are input to the decision unit 31 from the modulation setting unit 30. Furthermore, the reference clock signal 36 is input to the decision unit 31 from the clock source 33. The decision unit 31 compares the count of errors occurring with the modulation setting of the reference clock signal 36 based on the modulation factor setting signal 13 and the modulation frequency setting signal 14 against an allowable number of errors with the modulation setting of the reference clock signal 36 which is determined in advance. Specifically, the decision unit 31 recognizes decision synchronization based on the reference clock signal 36 and the modulation frequency setting signal 14 and performs the comparison at each decision synchronization. Then, the decision unit 31 outputs Fail when the count of errors exceeds the predetermined allowable number of errors and outputs Pass when the count does not exceed the allowable number as a signal 16 indicating decision information to a control device included in the electronic device 1000, for example. In addition, the decision unit 31 outputs, to the modulation setting unit 30, a setting change signal 34 that changes the modulation factor setting signal 13 and the modulation frequency setting signal 14 which are responsible for the current modulation setting of the reference clock signal 36 to the modulation factor setting signal 13 and the modulation frequency setting signal 14 for the next modulation setting.

The setting change signal 34 is input to the modulation setting unit 30 from the decision unit 31. The modulation setting unit 30 generates the modulation factor setting signal 13 and the modulation frequency setting signal 14 which are responsible for the next modulation setting of the reference clock signal 36 based on the setting change signal 34. Then, the modulation setting unit 30 outputs the generated modulation factor setting signal 13 and the modulation frequency setting signal 14 to the spread spectrum clock generator 6 of the transmitting unit 1, and the decision unit 31 and the accumulation unit 32 of the control unit 3.

Figure 5:
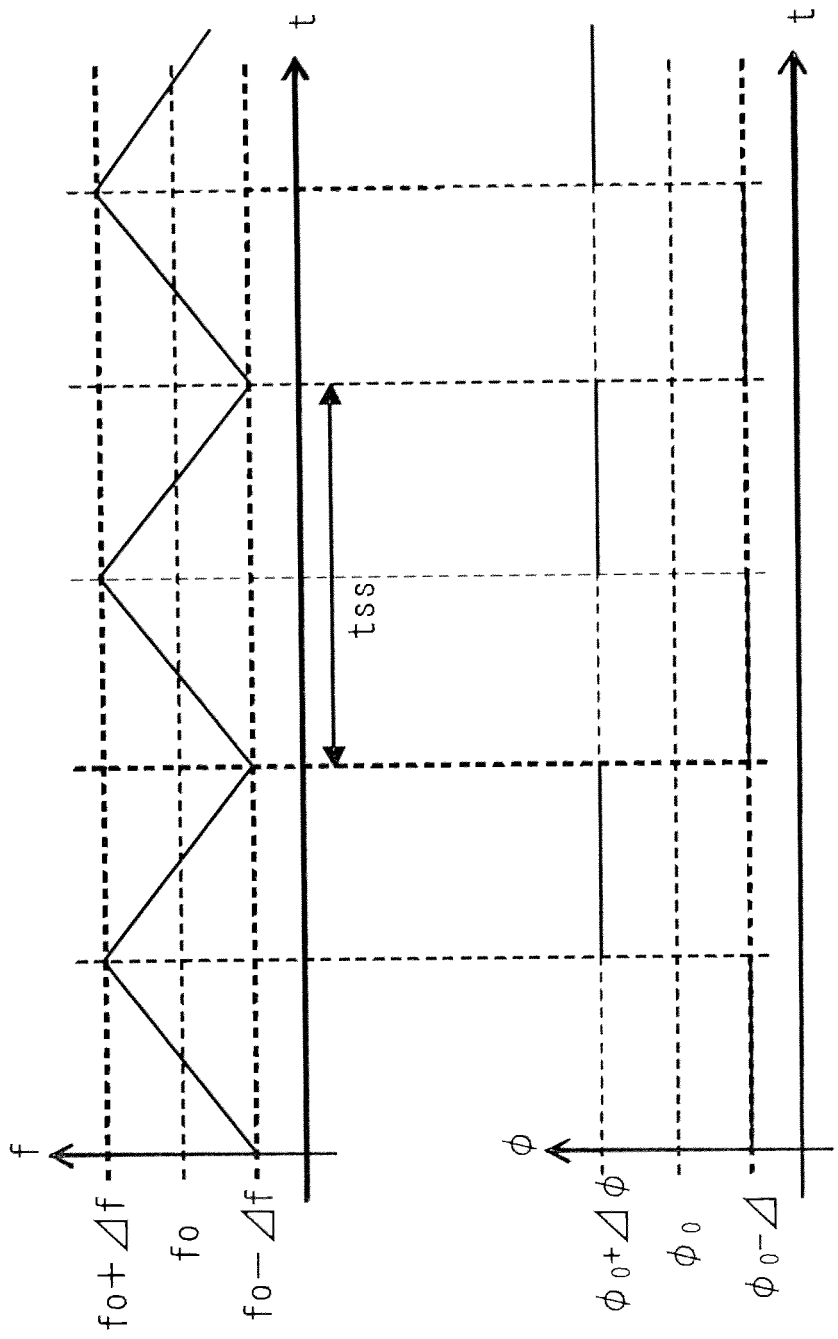
FIG. 5 is a view to illustrate a behavior of a clock and data recovery circuit.

The communication testing circuit having the above-described configuration executes the operation of transmitting and receiving the modulated data 11 as shown in FIG. 5, for example.

The frequency of the serial data 11 that is output from the transmitting unit 1 is spread by ±Δf relative to the center frequency fo of a clock signal by the spread spectrum clock generator 6. FIG. 5 shows the case where a modulation profile of a clock signal is a triangular waveform.

When the cycle of modulation of a clock signal is tss, the modulation frequency and the modulation factor of the clock signal can be defined as follows:

Modulation frequency=1/*tss*=*fss*

Modulation factor=Δ*f/fo=Dss*

The spread spectrum clock generator 6 can change the modulation frequency of the clock signal based on the modulation frequency setting signal 14 from the control unit 3 and further change the modulation factor of the clock signal based on the modulation factor setting signal 13 from the control unit 3.

In the clock and data recovery circuit 8 of the receiving unit 2, when the modulated data 11 is received, tracking delay (tracking skew) occurs in the PLL circuit 21, and a change occurs in the phase difference between the modulated data 11 and the extracted clock signal 22.

This is shown in FIG. 5, where φ indicates the phase difference.

φ=0 is a mean phase when there is no frequency modulation of the clock signal. With an increase and a decrease in the frequency of the modulated data 11, a phase difference of −Δφ or +Δφ is produced.

The relationship between the phase difference Δφ and the modulation frequency fss and the modulation factor Dss is as follows.

|Δφ|∝*fss*×*Dss*

Specifically, the absolute value of the phase difference Δφ is in proportion to the product of the modulation frequency fss and the modulation factor Dss. Therefore, by increasing the product of the modulation frequency fss and the modulation factor Dss, it is possible to arbitrarily increase the phase difference Δφ in the clock and data recovery circuit 8 of the receiving unit 2. By observing the signal 15 indicating error information from the pseudo-random binary sequence detector 10 at this point, it is possible to quantify a timing margin for transmission and reception. Thus, the frequency region where the count of errors that occur when the frequency of the reference clock signal is increased or decreased is less than the allowable number of errors can be determined as the timing margin.

Figure 6:
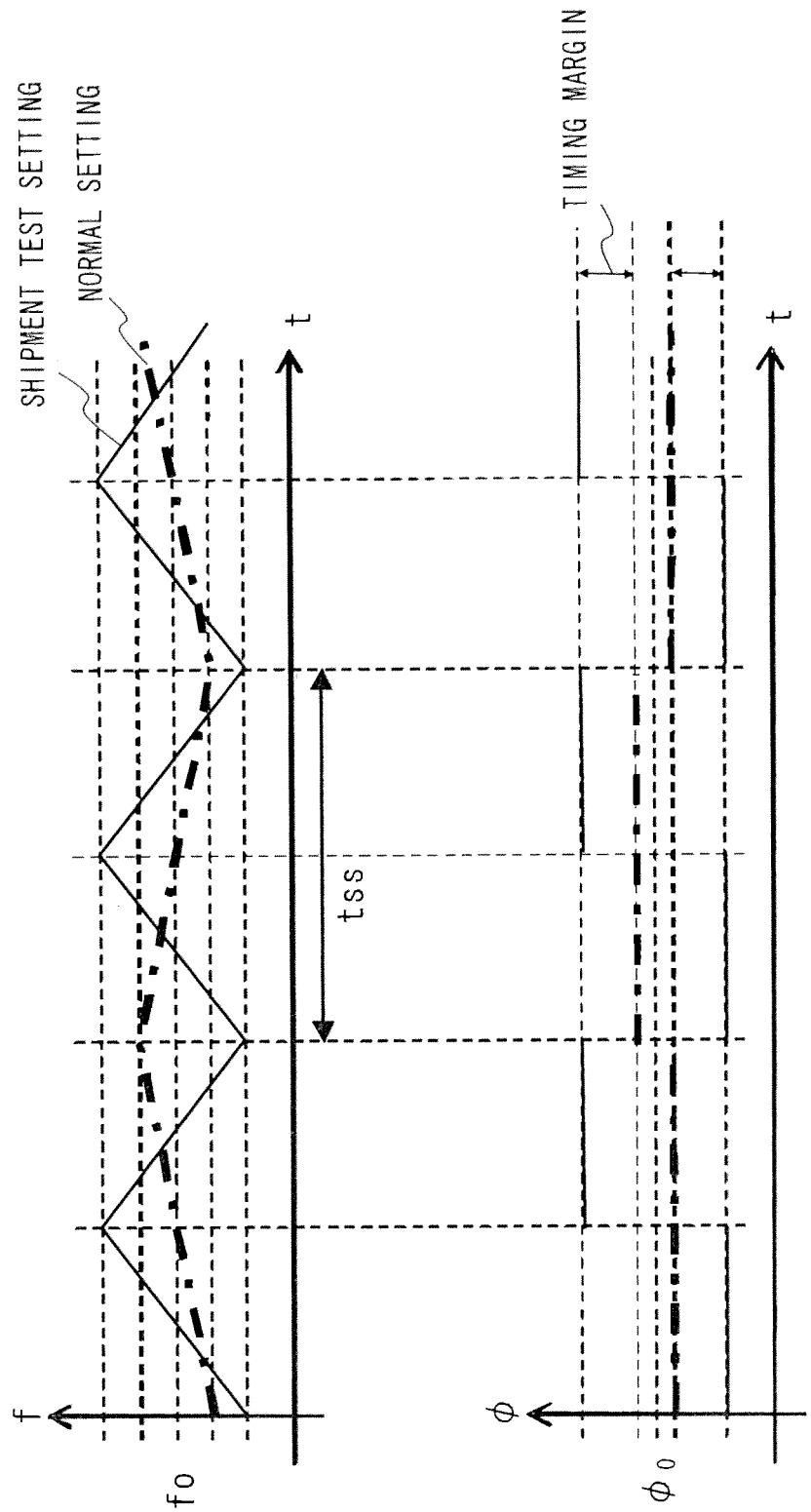
FIG. 6 is a view showing a relationship between a frequency modulation and a phase difference in a clock and data recovery circuit.

FIG. 6 shows the operation of the communication testing circuit 100 in the case where the modulation setting of the spread spectrum clock generator 6 at the time of pre-shipment testing is that the modulation frequency is double and the modulation factor is double. The phase difference Δφ can be produced to be four times greater than normal at the time of pre-shipment testing.

If it is assumed that an error in the receiving unit 2 begins to occur in this setting, the phase difference indicated by the arrow in FIG. 6 is a timing margin that is achieved during normal times.

Figure 7:
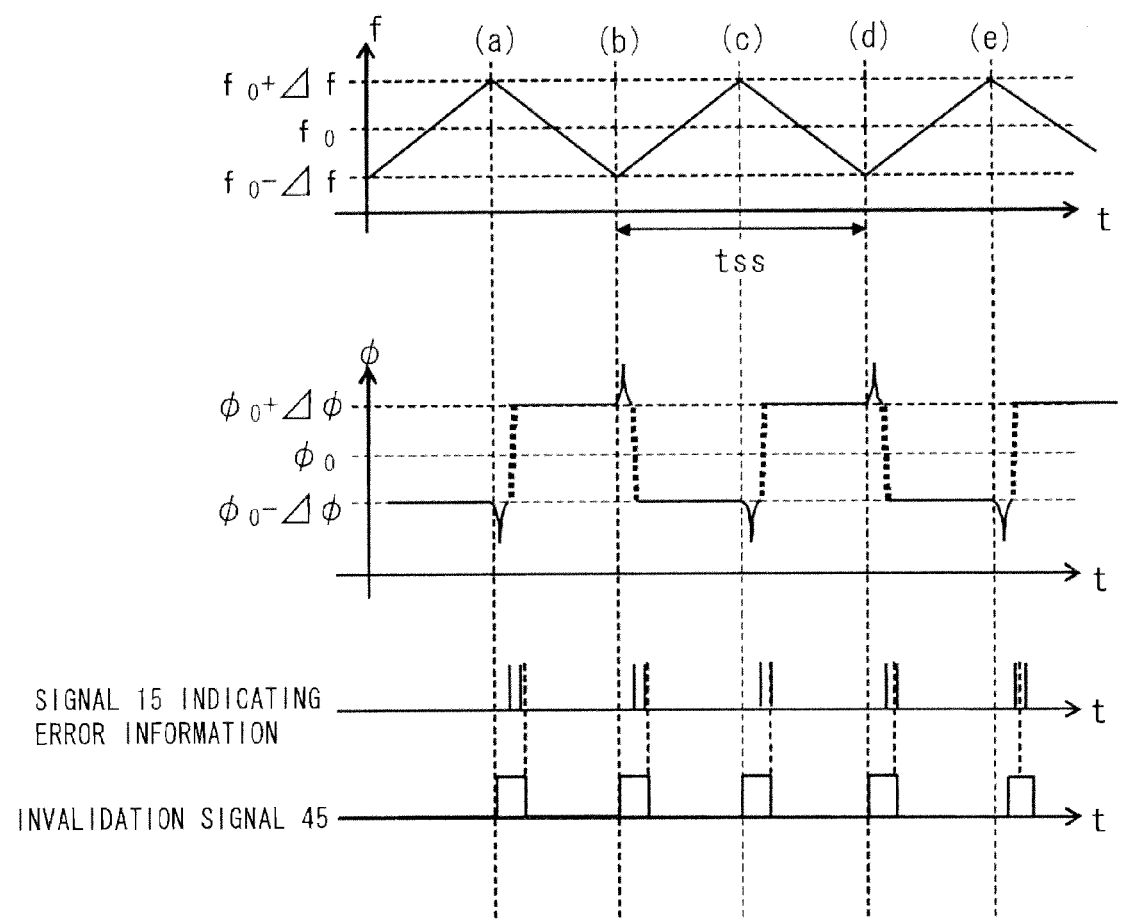
FIG. 7 is a view to illustrate a behavior of a phase difference and an action of an invalidation signal in a communication testing circuit.

However, in the actual PLL circuit 21, after the slope of modulation has changed as indicated by the points (a) to (e) in FIG. 7, the tracking skew increases temporarily, and an unwanted error occurs in some cases.

This makes it difficult to quantitatively decide a timing margin.

In order to handle this phenomenon, the timer 41 of the accumulation unit 32 generates the invalidation signal 45 for excluding an unwanted error that occurs at the point of change in the slope of frequency modulation of the reference clock signal, which is at the peak and bottom of the modulation factor, from the target of cumulative processing in the error counter 40 based on the signal 15 indicating error information and the modulation frequency setting signal 14. This is shown in FIG. 7.

Figure 8:
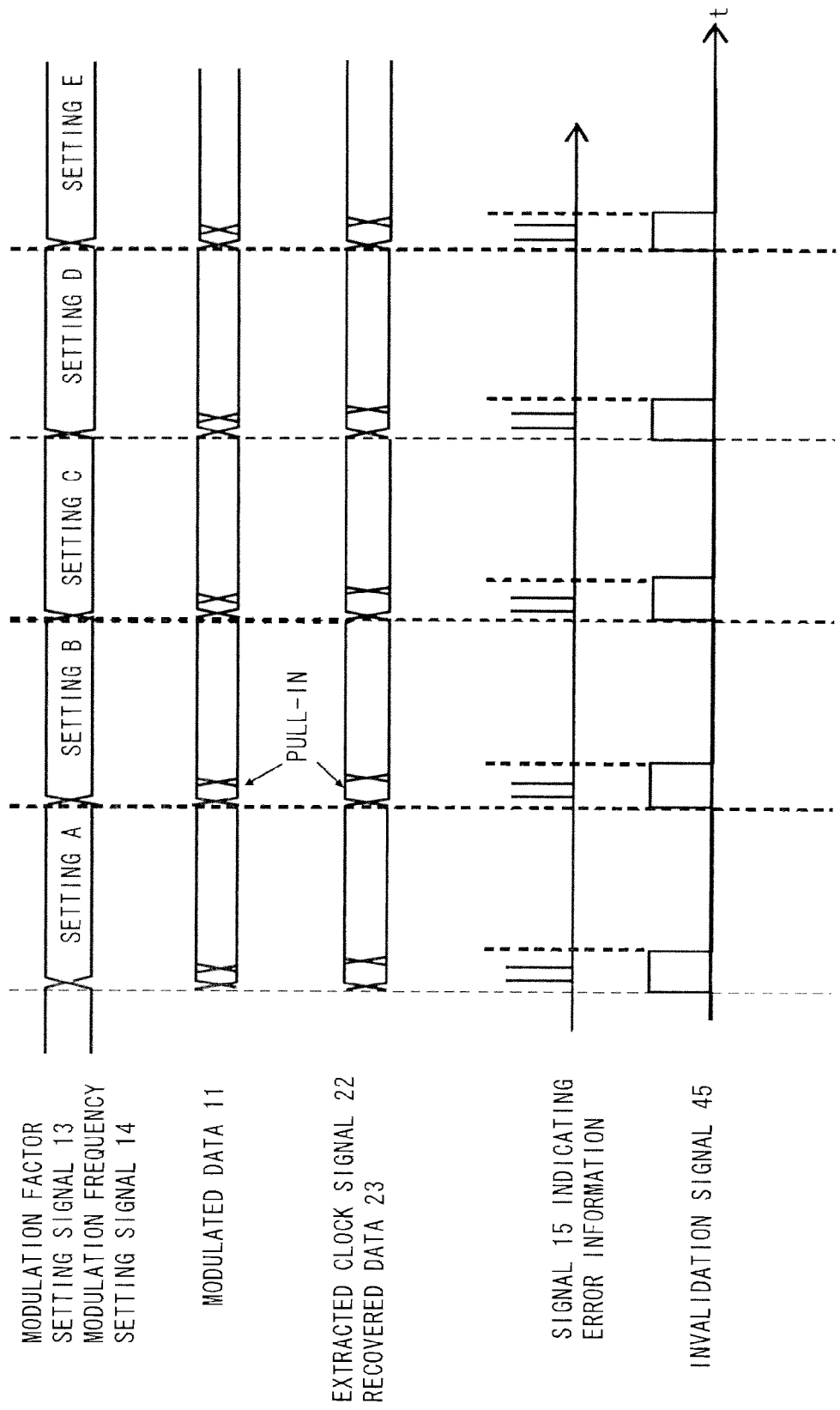
FIG. 8 is a view to illustrate an action of an invalidation signal at the switching of a frequency modulation setting.

During the period when the invalidation signal 45 is output from the timer 41, the error counter 40 performs processing that makes the number of errors counted from the signal 15 indicating error information excluded from the count. Further, the invalidation signal 45 is output for a certain period of time after the modulation factor setting signal 13 and the modulation frequency setting signal 14 are changed. This is because, when the modulation setting of the reference clock signal is changed, a pull-in time is taken in the spread spectrum clock generator 6 of the transmitting unit 1 and also a pull-in time is taken in the clock and data recovery circuit 8 of the receiving unit 2. This is shown in FIG. 8.

The communication testing circuit and the electronic device described above apply a mechanism that controls the modulation setting of the spread spectrum clock generator 6 which is generally included as standard equipment in a transmitting-end device in order to reduce EMI, and characteristics of tracking skew that occurs when tracking a frequency modulation which are seen in the clock and data recovery circuit 8 of a receiving-end device, and need no special measuring instrument. Therefore, the transmitting unit 1 and the receiving unit 2 can be used not only for testing but also for normal operation, and it is possible to quantitatively decide a transmitting/receiving timing margin in serial communication at low cost and in short time.

Particularly, the electronic device that includes the communication testing circuit preferably has a configuration that inputs a self-diagnosis start signal to the control unit 3 upon power-up of the electronic device. It is thereby possible to easily conduct a self-diagnosis test using the communication testing circuit 100 upon power-up of the electronic device.

<Second Embodiment>

Although the communication testing circuit 100 according to the first embodiment handles an error that occurs at the point of change in the slope of frequency modulation of the clock signal by generating the invalidation signal 45, the present invention is not limited thereto. Specifically, the error counter 40 may have a configuration that subtracts the number of errors estimated based on a value in proportion to the product of the modulation factor and the modulation frequency of the clock signal from the count to handle an error that occurs at the point of change in the slope of frequency modulation of the clock signal.

<Third Embodiment>

Figure 9:
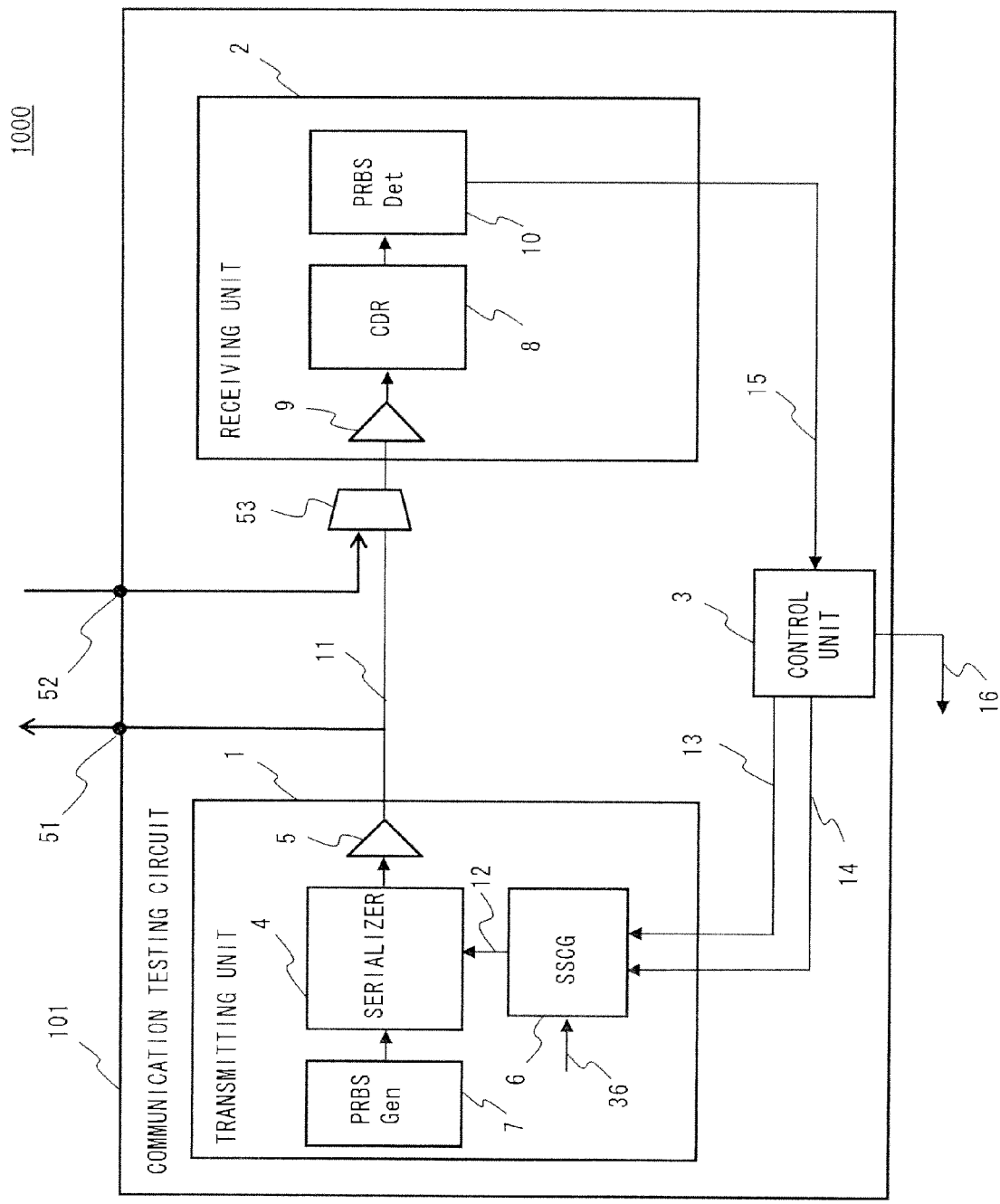
FIG. 9 is a block diagram showing a configuration of an electronic device that includes a communication testing circuit according to a third embodiment of the invention.

Further, as shown in a communication testing circuit 101 in FIG. 9, in order to bring test conditions closer to actual use conditions, the modulated data 11 output from the output circuit 5 may be once output from the communication testing circuit 101 to the outside, and then the modulated data 11 may be input to the communication testing circuit 101 from the outside.

Specifically, the communication testing circuit 101 according to this embodiment, which has substantially the same configuration as the communication testing circuit 100 according to the first embodiment, further includes an output terminal 51, an input terminal 52, and a selector 53. The modulated data 11 that is output from the output circuit 5 of the transmitting unit 1 is output to the outside from the output terminal 51. The modulated data 11 that is output to the outside is input from the input terminal 52. The output terminal 51 and the input terminal 52 are electrically connected through a transmission line such as a coaxial cable or a wiring board.

The selector 53 is placed between the transmitting unit 1 and the receiving unit 2. The selector 53 selects the modulated data 11 that is output from the output circuit 5 of the transmitting unit 1 or the modulated data 11 that is once output to the outside and then input from the input terminal 52 based on a mode switching signal from the outside, a mode switching signal from the control unit 3 or the like, and outputs the selected data to the input circuit 9 of the receiving unit 2.

By outputting the modulated data 11 that is output from the output circuit 5 of the transmitting unit 1 from the communication testing circuit 101 to the outside and then inputting the modulated data 11 to the communication testing circuit 101 from the outside through a transmission line as described above, it is possible to bring test conditions closer to actual use conditions. The communication testing circuit 101 can thereby improve the testing accuracy.

On the other hand, in the case where it is desirable to complete the testing within the communication testing circuit 101, the selector 53 may select the modulated data 11 that is output from the output circuit 5 of the transmitting unit 1. In this manner, the communication testing circuit 101 allows a test operator to select test conditions as appropriate.

<Fourth Embodiment>

Figure 10:
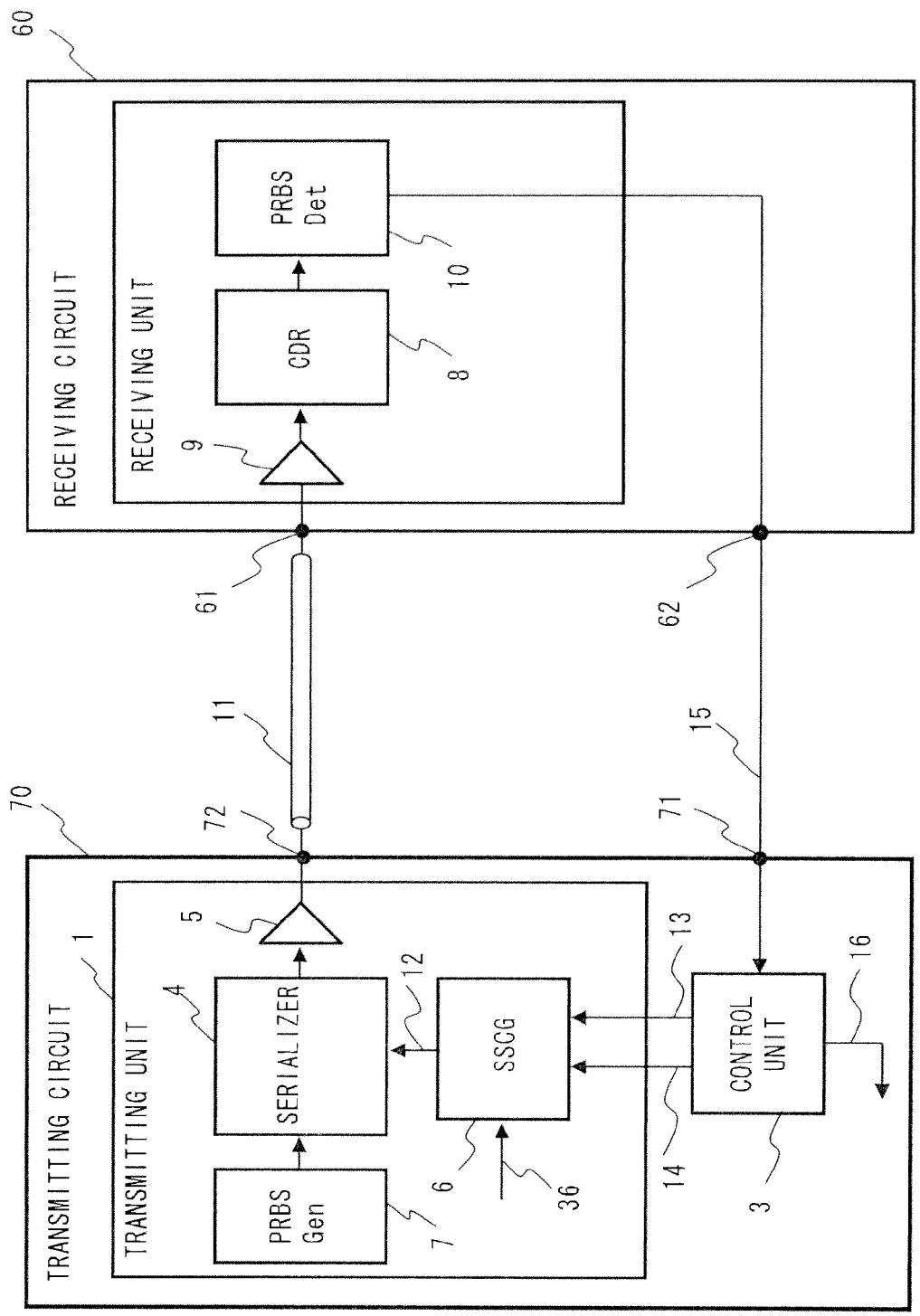
FIG. 10 is a block diagram showing configurations of a receiving circuit and a transmitting circuit according to a fourth embodiment of the invention.

Although the communication testing circuit is composed of the transmitting unit 1, the receiving unit 2 and the control unit 3, which are mounted on the same chip, for example, in the embodiments described above, the communication testing circuit may have a configuration in which a receiving circuit 60 and a transmitting circuit 70 are separated as shown in FIG. 10.

The receiving circuit 60 includes the receiving unit 2 described above. The receiving circuit 60 further includes an input terminal 61 of the modulated data 11 that is output from the output circuit 5 of the transmitting circuit 70, and an output terminal 62 of the signal 15 indicating error information that is output from the pseudo-random binary sequence detector 10. Thus, the modulated data 11 that is output from the output circuit 5 of the transmitting circuit 70 is input to the receiving circuit 60 through the input terminal 61. Further, the receiving circuit 60 outputs the signal 15 indicating error information to the transmitting circuit 70 through the output terminal 62.

The transmitting circuit 70 includes the transmitting unit 1 and the control unit 3 described above. The transmitting circuit 70 further includes an input terminal 71 of the signal 15 indicating error information that is output from the pseudo-random binary sequence detector 10 of the receiving circuit 60, and an output terminal 72 of the modulated data 11 that is output from the output circuit 5. Thus, the signal 15 indicating error information that is output from the pseudo-random binary sequence detector 10 of the receiving circuit 60 is input to the transmitting circuit 70 through the input terminal 71.

Further, the transmitting circuit 70 outputs the modulated data 11 to the receiving circuit 60 through the output terminal 72.

By separating the receiving circuit 60 and the transmitting circuit 70, the power supply and the ground of the receiving circuit 60 and the power supply and the ground of the transmitting circuit 70 can be made different, which makes it possible to bring test conditions closer to actual use conditions.

When the receiving circuit 60 is mounted on a semiconductor integrated circuit, the transmitting circuit 70 is mounted on another semiconductor integrated circuit, a testing board, or a tester. On the other hand, when the receiving circuit 60 is mounted on a testing board or a tester, the transmitting circuit 70 is mounted on a semiconductor integrated circuit.

Figure 11:
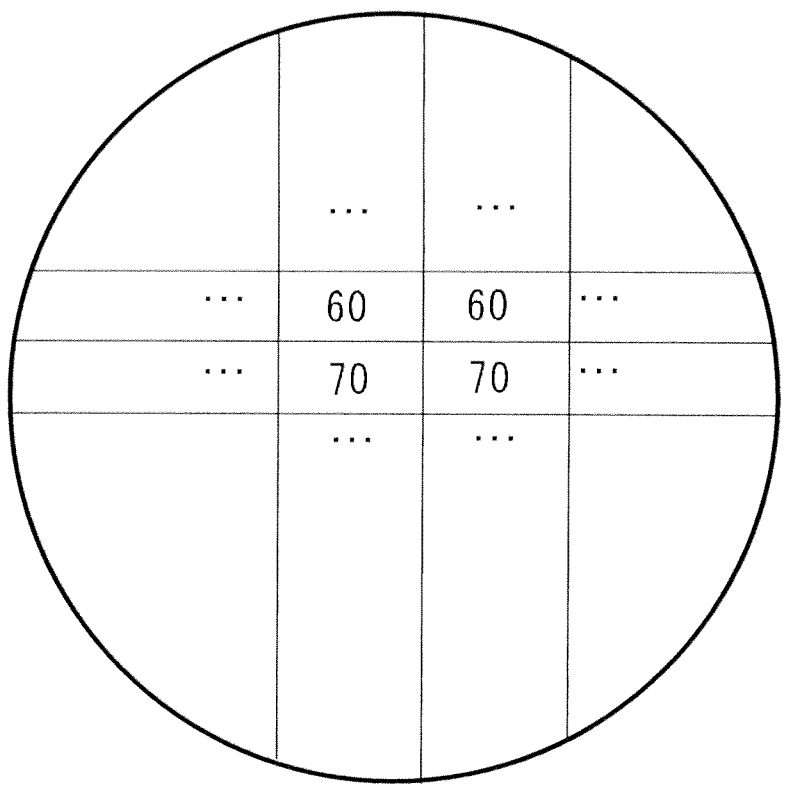
FIG. 11 is a view schematically showing a wafer in which the receiving circuit and the transmitting circuit according to the fourth embodiment are mounted on adjacent chips.

In this case, as shown in FIG. 11, the receiving circuit 60 and the transmitting circuit 70 may be respectively mounted on chips that are adjacent in the same wafer. It is thereby possible to easily conduct testing between the adjacent chips.

Note that, although the transmitting circuit 70 includes the control unit 3 in this embodiment, the embodiment can be implemented in substantially the same manner with the configuration in which the receiving circuit 60 includes the control unit 3.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution, The above-described embodiments can be combined as desirable by one of ordinary skill in the art.

What is claimed is:

1. A communication testing circuit comprising:
   a transmitting unit including
      a spread spectrum clock generator that generates a modulated clock signal by modulating a reference clock signal,
      a pseudo-random binary sequence generator that generates a pseudo-random pattern, and
      a signal generator that generates a transmission signal by modulating the pseudo-random pattern based on the modulated clock signal;
   a receiving unit including
      a clock and data recovery circuit that receives the transmission signal and recovers the pseudo-random pattern from the transmission signal, and
      a detector that compares the recovered pseudo-random pattern with a preset pseudo-random pattern and outputs a signal indicating error information; and
   a control unit that counts a number of errors from the signal indicating error information input from the receiving unit and decides a timing margin based on a counting result,
   wherein the control unit generates a modulation factor setting signal for controlling a modulation factor of the reference clock signal and a modulation frequency setting signal for controlling a modulation frequency of the reference clock signal, and outputs the modulation factor setting signal and the modulation frequency setting signal to the spread spectrum clock generator.

2. The communication testing circuit according to claim 1, wherein the control unit includes
a clock source that generates the reference clock signal,
an accumulation unit that receives the modulation factor setting signal, the modulation frequency setting signal and the reference clock signal, and counts a number of errors from the signal indicating error information for a specified period of time based on the modulation factor setting signal, the modulation frequency setting signal and the reference clock signal,
a decision unit that receives a signal indicating a count of the number of errors, the modulation factor setting signal, the modulation frequency setting signal and the reference clock signal, compares the count with a predetermined allowable number of errors with the modulation factor setting signal and the modulation frequency setting signal, decides a timing margin based on a comparison result, and generates a setting change signal for changing the modulation factor setting signal and the modulation frequency setting signal, and
a modulation setting unit that receives the setting change signal and generates a modulation factor setting signal and a modulation frequency setting signal different from the modulation factor setting signal and the modulation frequency setting signal.

3. The communication testing circuit according to claim 2, wherein the accumulation unit includes
a timer that receives the modulation factor setting signal, the modulation frequency setting signal and the reference clock signal, and generates a counting period setting signal for setting a counting period to count a number of errors from the signal indicating error information and a clear signal for resetting an accumulated count after the counting period has elapsed,
an error counter that receives the signal indicating error information, the counting period setting signal and the clear signal, counts and accumulates a number of errors from the signal indicating error information during the counting period indicated by the counting period setting signal, outputs an error count signal indicating a count of the number of errors after the counting period has elapsed, and, upon receiving the clear signal, resets the count, and
a holding unit that receives the error count signal and the counting period setting signal, holds the count after the counting period has elapsed, and outputs a signal indicating the count to the decision unit.

4. The communication testing circuit according to claim 3, wherein the timer generates an invalidation signal for an error occurring at a point of change in a slope of frequency modulation of the reference clock signal so as not to count the error, and outputs the invalidation signal to the error counter.

5. The communication testing circuit according to claim 3, wherein the error counter subtracts the number of errors estimated based on a value in proportion to a product of a modulation factor and a modulation frequency of the reference clock signal from the count for an error occurring at a point of change in a slope of frequency modulation of the reference clock signal.

6. The communication testing circuit according to claim 1, further comprising:
a selector placed between the transmitting unit and the receiving unit;
an output terminal that outputs the transmission signal to outside; and
an input terminal that inputs a reception signal from outside,
wherein the transmission signal output from the transmitting unit can be output to outside, and the selector selects one of the reception signal and the transmission signal and outputs the selected signal to the receiving unit.

7. The communication testing circuit according to claim 1, wherein the transmitting unit is used also in normal use mode.

8. The communication testing circuit according to claim 1, wherein the receiving unit is used also in normal use mode.

9. A semiconductor integrated circuit comprising the communication testing circuit according to claim 1.

10. An electronic device comprising the communication testing circuit according to claim 1.

11. The electronic device according to claim 10, wherein a self-diagnosis start signal is input to the control unit upon power-up of the electronic device, and the communication testing circuit conducts testing based on the self-diagnosis start signal.

* * * * *